(12) United States Patent
Kaneko et al.

(10) Patent No.: US 11,866,281 B2
(45) Date of Patent: Jan. 9, 2024

(54) ELECTROSTATIC ADSORPTION BODY

(71) Applicant: CREATIVE TECHNOLOGY CORPORATION, Kawasaki (JP)

(72) Inventors: Daiki Kaneko, Kawasaki (JP);
Yoshiaki Tatsumi, Kawasaki (JP);
Shinsuke Hirano, Kawasaki (JP)

(73) Assignee: CREATIVE TECHNOLOGY CORPORATION, Kawasaki (JP)

(*) Notice: Subject to any disclaimer, the term of this patent is extended or adjusted under 35 U.S.C. 154(b) by 539 days.

(21) Appl. No.: 17/265,047

(22) PCT Filed: Aug. 1, 2019

(86) PCT No.: PCT/JP2019/030145
§ 371 (c)(1),
(2) Date: Feb. 1, 2021

(87) PCT Pub. No.: WO2020/027246
PCT Pub. Date: Feb. 6, 2020

(65) Prior Publication Data
US 2021/0300698 A1     Sep. 30, 2021

(30) Foreign Application Priority Data

Aug. 2, 2018 (JP) ................................ 2018-145547

(51) Int. Cl.
*B65H 3/18* (2006.01)
*B25J 15/06* (2006.01)
(Continued)

(52) U.S. Cl.
CPC ............... *B65H 3/08* (2013.01); *B25J 15/06* (2013.01); *B32B 15/082* (2013.01); *B32B 15/20* (2013.01);
(Continued)

(58) Field of Classification Search
CPC .... B65H 3/18; B65H 5/004; B65H 2701/174; B65H 2801/72; B65H 2301/44334;
(Continued)

(56) References Cited

U.S. PATENT DOCUMENTS

2007/0223173 A1    9/2007  Fujisawa et al.
2012/0120545 A1    5/2012  Fujisawa et al.
(Continued)

FOREIGN PATENT DOCUMENTS

EP      3 777 671 A1       2/2021
JP      62-244830 A       10/1987
(Continued)

OTHER PUBLICATIONS

English translation of International Preliminary Report on Patentability dated Dec. 3, 2020, in PCT/JP2019/030145.
(Continued)

*Primary Examiner* — Dharti H Patel
(74) *Attorney, Agent, or Firm* — Birch, Stewart, Kolasch & Birch, LLP

(57) ABSTRACT

Provided is an electrostatic adsorption body capable of exhibiting a high adsorption force, especially with respect to a highly insulative sheet-like object to be adsorbed, such as a cloth, while using an electrical adsorption force. This electrostatic adsorption body, which uses electrostatic force to adsorb an object to be adsorbed, is provided with: a laminate sheet in which a 20-200 μm-thick insulator, a 1-20 μm-thick electrode layer, and a 20-200 μm-thick resin film are sequentially laminated; and a power supply device that applies a voltage to the electrode layer, wherein the resin film at least has a tensile modulus of 1 MPa or more and less than 100 MPa and a volume resistivity of $1 \times 10^{10}$-$10^{13}$ Ω cm, the electrode layer is composed of a bipolar electrode including a positive electrode and a negative electrode, and
(Continued)

an object to be adsorbed is adsorbed using the resin film as an adsorption surface due to an electrostatic adsorption force that is generated by applying a voltage to the electrode layer.

7 Claims, 3 Drawing Sheets

(51) Int. Cl.
*B32B 15/082* (2006.01)
*B32B 15/20* (2006.01)
*B32B 27/28* (2006.01)
*B32B 27/30* (2006.01)
*B65H 3/08* (2006.01)

(52) U.S. Cl.
CPC .......... *B32B 27/281* (2013.01); *B32B 27/304* (2013.01); *B32B 2250/03* (2013.01); *B32B 2307/202* (2013.01); *B32B 2307/206* (2013.01); *B32B 2457/00* (2013.01)

(58) Field of Classification Search
CPC ..... B25J 15/06; B25J 15/0085; B32B 15/082; B32B 15/20; B32B 27/281; B32B 27/304; B32B 2250/03; B32B 2307/202; B32B 2307/206; B32B 2457/00; H01L 21/6833; H02N 13/00
USPC .......................................................... 361/234
See application file for complete search history.

(56) References Cited

U.S. PATENT DOCUMENTS

| 2013/0277357 A1 | 10/2013 | Tatsumi et al. |
| 2014/0009881 A1 | 1/2014 | Tatsumi et al. |

FOREIGN PATENT DOCUMENTS

| JP | 6-178883 A | 6/1994 | |
| JP | 7-68066 A | 3/1995 | |
| JP | 2005-191515 A | 7/2005 | |
| JP | 2008-244148 A | 10/2008 | |
| JP | 2014-30887 A | 2/2014 | |
| WO | WO 2005/091356 A1 | 9/2005 | |
| WO | WO 2011/001978 A1 | 1/2011 | |
| WO | WO 2012/090782 A1 | 7/2012 | |
| WO | WO 2012/128147 A1 | 9/2012 | |
| WO | WO 2012/165250 A1 | 12/2012 | |
| WO | WO-2019188341 A1 * | 10/2019 | ............... A61B 5/25 |

OTHER PUBLICATIONS

International Search Report (PCT/ISA/210) issued in PCT/JP2019/030145, dated Sep. 24, 2019.
Written Opinion of the International Searching Authority (PCT/ISA/237) issued in PCT/JP2019/030145, dated Sep. 24, 2019.

* cited by examiner

[Fig.1]

[Fig.4]
(i)　　　　　　　　　　　　　　(ii)
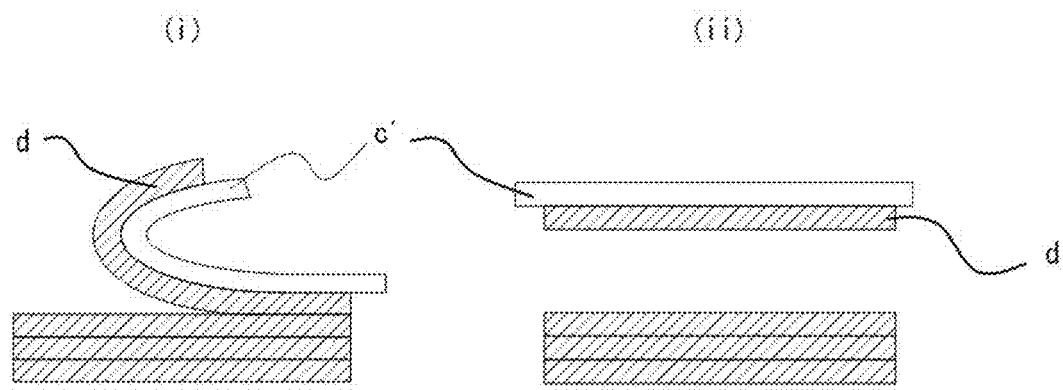
[Fig.5]
(i)　　　　　　　　　　　　　　(ii)
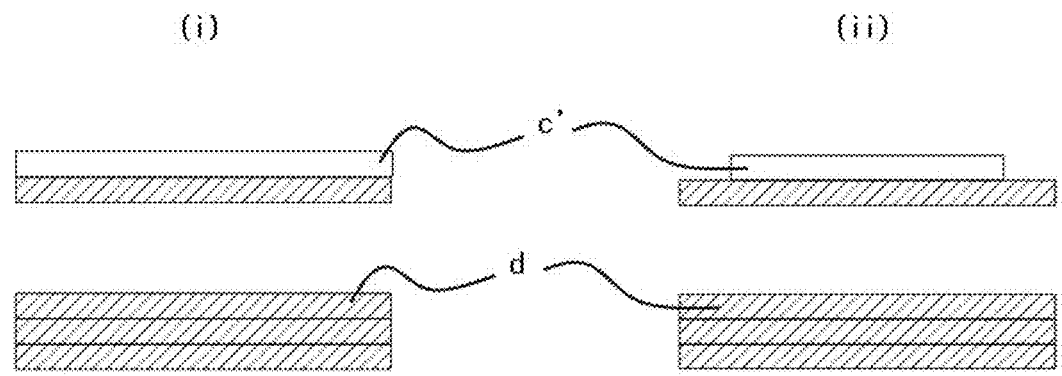

ELECTROSTATIC ADSORPTION BODY

TECHNICAL FIELD

The invention relates to an electrostatic adsorption body that can adsorb an object to be adsorbed by using an electrical adsorption force, and more specifically, an electrostatic adsorption body that can adsorb a sheet-like insulation component such as paper or cloth.

BACKGROUND ART

In the related art, several methods of gripping and transporting a sheet-like object to be adsorbed such as paper or cloth have been reported, and in particular, methods of peeling, gripping, and transporting one by one a plurality of stacked pieces of cloth and the like have been reported. For example, a method in which an adsorption surface is elaborated using an adhesive tape as a holding part for an object to be adsorbed (refer to PTL 1), a method in which a hook roller having a plurality of hook needles on the surface of a roller is used (refer to PTL 2), and a method in which, as a grip part, the abovementioned adhesive tapes, needles, or a negative pressure of air are used and air is blown to the stacked pieces of cloth and the like to implement peeling (refer to PTL 3) have been reported. However, methods using an adhesive tape such as one in PTL 1 have problems whereby, if the adhesive force becomes weaker, the tape needs to be replaced, which increases the cost, and when the object to be adsorbed has been peeled off from the adhesive tape, approaches to address this are necessary. In addition, methods of hooking and griping using needles such as in PTL 2 are not preferable because there is a risk of the object to be adsorbed being damaged, and also the methods of using a negative pressure or compressed air for gripping or peeling off the object to be adsorbed such as the method of PTL 3 have problems whereby, for example, the size of a device becomes larger because a compressor is necessary in addition to a problem of adsorption traces remaining on the object to be adsorbed.

On the other hand, in addition to the above methods, in particular, as a method of gripping and transporting a sheet-like transportation component such as cloth in which air leakage occurs, a method of charging a grip part and using its electrostatic force has been reported (refer to PTL 4). In PTL 4, a method of emitting electrons or ions from a charging device (charging gun) used in combination and then charging a grip part (a first grip piece 17) and an object to be adsorbed (a transportation component 101), or use of an electrostatic chuck or the like as the grip part (the first grip piece 17) has been reported.

Incidentally, in the related art, an electrostatic chuck has been used to adsorb an object to be adsorbed with an electrical adsorption force. The electrostatic chuck is preferably used for adsorbing and holding when a semiconductor substrate or a glass substrate is processed, and the electrostatic chuck generally has a structure in which electrodes are interposed between dielectrics in the vertical direction, and can adsorb an object to be adsorbed using one surface of each of the dielectrics as an adsorption surface by applying a voltage to an electrode according to the adsorption principle, and has a heating unit in some cases or has a structure that is integrally bonded to a metal base having a conduit through which a refrigerant flows. In addition, in addition to the electrostatic chuck that processes such a semiconductor substrate and the like, the inventors have proposed an electrostatic adsorption structure in which an electrical adsorption structure and the principle of the electrostatic chuck are applied.

For example, PTL 5 proposes an electrostatic adsorption structure, the configuration of which can be conveniently changed, in which a plurality of sheet members in which electrodes are interposed between two dielectrics are laminated and a voltage is applied between the electrodes, whereby the members can be adsorbed and fixed to each other, and a display or bulletin object, such as paper or a resin sheet, can be adsorbed on the other adsorption surface, and when the application of the voltage is stopped after use, the sheet members and the object to be adsorbed can be easily separated. In addition, for example, PTL 6 proposes a power generating device having favorable installation location selectivity and detachability using the surface of the electrostatic chuck, in which an adsorption electrode is interposed between two insulation layers, as a detachable means, and a film-like solar cell is attached thereto. The electrostatic adsorption structure in PTL 5 and the power generating device in PTL 6 have favorable detachability due to the use of an adsorption principle of the electrostatic chuck, and are thin and elaborated for superior handling properties. However, in prior studies, the inventors have found that, in the electrostatic chucks that have been reported hitherto, such as the electrostatic adsorption structure described in PTL 5 and the power generating device described in PTL 6, based on the speculation that the volume resistivity of a polyimide film or a polyethylene terephthalate (PET) film used as a dielectric layer (insulator) is high at about $1 \times 10^{17}$ Ω·cm and that the object to be adsorbed is adsorbed due to a Coulomb force, a strong adsorption force, in particular, cannot always be exhibited for highly insulating cloth.

Here, the applicants of this application have also proposed technologies described in PTL 7 and PTL 8 as inventions related to the electrostatic chuck in addition to the above. Here, in PTL 7, paragraph 0066 (Test Example 4) and FIG. 26 illustrate a graph showing the change in time constant and resistance when the volume resistivity is reduced from $1 \times 10^{14}$ Ω·m to the about $1 \times 10^{8}$ Ω·m that a polyimide exhibits. However, this is simply a numerical simulation assuming the reduction in the time constant of the electrostatic chuck (elimination of the difficulty of peeling the sample off of the sample adsorption surface) which is the subject of paragraph 0041 of the same literature, and an actual polyimide film cannot obtain such a low volume resistivity, and generally, a polyimide has a high tensile modulus of about 3 GPa and has poor shape conformability to the object to be adsorbed. Therefore, as described above, when a polyimide film is used as a dielectric layer (insulator) on the adsorption surface of the object to be adsorbed, a higher adsorption force is unlikely to be exhibited for a sheet-like adsorption component such as highly insulating cloth. In addition, in PTL 8, it is described in paragraph 0028 that a resin material having a modulus of elasticity of 0.5 MPa or more and 10 MPa or less is used as a material constituting a workpiece processing device. However, this resin material simply plays a role of an "adsorption sheet" that is expected to have a function of adsorbing and fixing a heater member and a base platform in a workpiece heating device in the same literature, and a mode of use as a dielectric layer (insulator) of an adsorption surface of the object to be adsorbed in order to adsorb a sheet-like adsorption component such as highly insulating cloth is still not disclosed.

CITATION LIST

Patent Literature

[PTL 1] Japanese Patent Application Publication No. S62-244830
[PTL 2] Japanese Patent Application Publication No. H06-178883
[PTL 3] Japanese Patent Application Publication No. H07-68066
[PTL 4] Japanese Patent Application Publication No. 2014-30887
[PTL 5] WO 2011/001978
[PTL 6] WO 2012/128147
[PTL 7] WO 2005/091356
[PTL 8] WO 2012/090782

SUMMARY OF INVENTION

Technical Problem

As described above, the inventors have conducted extensive studies in the situation where, with the conventional electrostatic chuck, a sufficient adsorption force, in particular, is unlikely to be exhibited for a highly insulative sheet-like object to be adsorbed such as cloth, and as a result, found that, when a resin film having a specific tensile modulus and a specific volume resistivity is used for at least an adsorption surface for an object to be adsorbed, this film and other insulators are laminated with an electrode layer therebetween to form a laminate sheet, whereby a simple electrostatic adsorption body used together with a power supply device that allow application of a voltage to the electrode layer is configured, a strong adsorption force can be exhibited for a highly insulative sheet-like object to be adsorbed such as cloth, and as a result completed the present invention. In addition, the inventors have found that, in addition to configuring the electrostatic adsorption body as described above, when the shape and the like of the electrostatic adsorption body are elaborated, the sheet-like object to be adsorbed can be reliably adsorbed (peeled off) one by one.

Therefore, an object of the present invention is to provide an electrostatic adsorption body that can exhibit a higher adsorption force, in particular, with respect to a highly insulative sheet-like object to be adsorbed, such as a cloth, by using an electrical adsorption force.

Solution to Problem

Specifically, the gist of the present invention is as follows.
[1] An electrostatic adsorption body adsorbing an object to be adsorbed with an electrostatic adsorption force, the electrostatic adsorption body including: a laminate sheet in which an insulator with a thickness of 20 to 200 μm, an electrode layer with a thickness of 1 to 20 μm, and a resin film with a thickness of 20 to 200 μm are sequentially laminated; and a power supply device that applies a voltage to the electrode layer, wherein the resin film at least has a tensile modulus of 1 MPa or more and less than 100 MPa and a volume resistivity of $1 \times 10^{10}$ to $10^{13}$ Ω·cm, the electrode layer is composed of a bipolar electrode including a positive electrode and a negative electrode, and an object to be adsorbed is adsorbed using the resin film as an adsorption surface due to an electrostatic adsorption force that is generated by applying a voltage to the electrode layer.
[2] The electrostatic adsorption body according to [1], wherein the resin film is composed of soft polyvinyl chloride.
[3] The electrostatic adsorption body according to [1] or [2], wherein the electrode layer composed of the bipolar electrode is a pair of comb-like electrodes.
[4] The electrostatic adsorption body according to [3], wherein the electrode layer composed of the bipolar electrode is formed by meshing comb teeth of the pair of comb-like electrodes on a same plane while maintaining a certain interval therebetween, a width of each of the comb teeth is 0.5 to 20 mm, and the interval between the comb teeth is 0.5 to 10 mm.
[5] The electrostatic adsorption body according to any one of [1] to [4], wherein at least the adsorption surface adsorbing the object to be adsorbed is a curved surface.
[6] The electrostatic adsorption body according to any one of [1] to [5], wherein an area of the adsorption surface is smaller than an area of the object to be adsorbed.
[7] The electrostatic adsorption body according to any one of [1] to [6], wherein the object to be adsorbed is a sheet-like insulation component.

Advantageous Effects of Invention

According to the present invention, it is possible to provide an electrostatic adsorption body that can exhibit a higher adsorption force particularly for a highly insulative sheet-like object to be adsorbed such as cloth while using an electrical adsorption force. Since adsorption and fixing can be performed with the electrical adsorption force in this manner, without using a physical means such as an adhesive tape or a needle, a sheet-like object to be adsorbed such as cloth can be easily and reliably adsorbed and gripped, which is cost effective. Thus, when the technology of the present invention is used, for example, by mounting it in a robot, it is possible to improve productivity of clothing products due to efficient sewing operations in garment factories, and for example, deployment in fields and industries such as apparel is expected.

BRIEF DESCRIPTION OF DRAWINGS

In FIG. 3, the white arrow indicates a horizontal direction.

FIG. 4 is a schematic diagram for explaining evaluation of adsorption in Test Examples 18 and 19, (i) shows an adsorption state of Test Example 18, and (ii) shows an adsorption state of Test Example 19.

FIG. 5 shows schematic diagrams for explaining evaluation of adsorption in Test Examples 20 and 21, (i) shows an adsorption state of Test Example 20, and (ii) shows an adsorption state of Test Example 21.

DESCRIPTION OF EMBODIMENTS

Hereinafter, the present invention will be described in detail.

Figure 1:
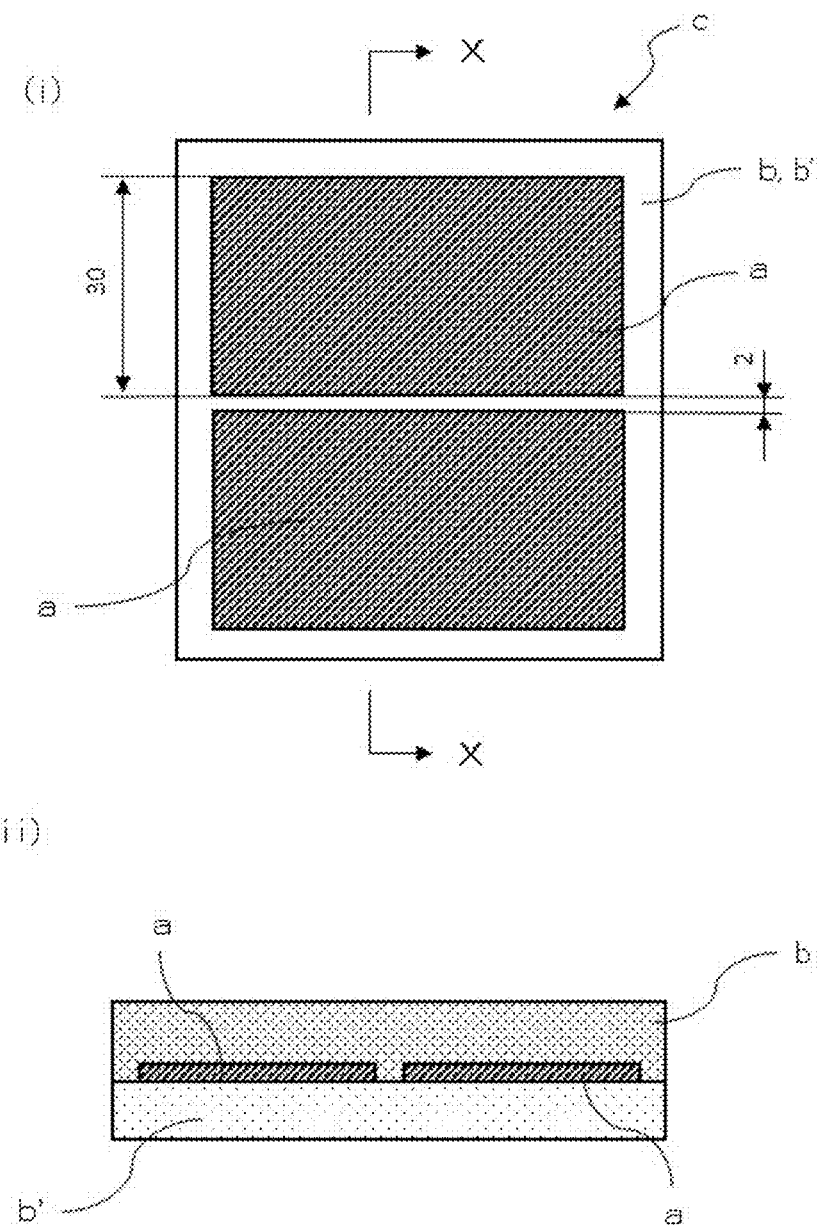
FIG. 1 shows schematic diagrams for illustrating a bipolar electrode (hereinafter also referred to as a "flat type") used in an electrostatic adsorption body (laminate sheet) according to Example 1, (i) is a plan view, and (ii) is a cross-sectional illustrative diagram in the X-X cross section [numerical values in FIG. 1 indicate that the width of each electrode is 30 mm and the interval (pitch) between electrodes is 2 mm].
Figure 2:
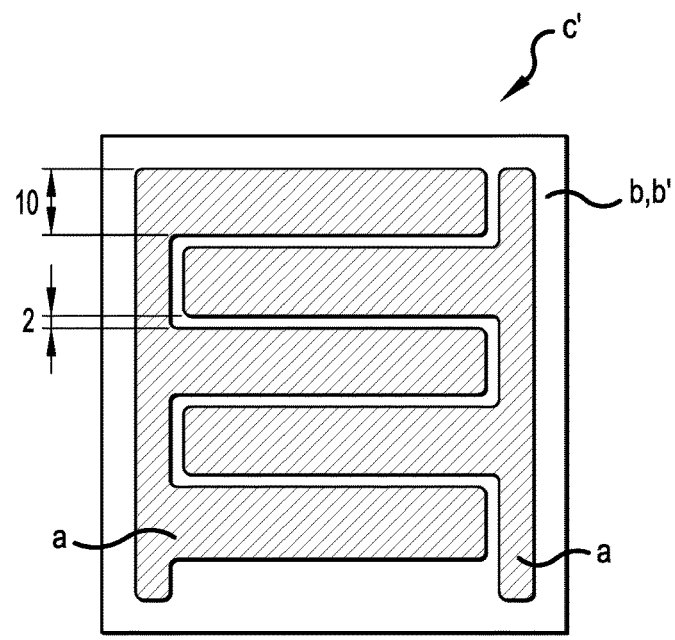
FIG. 2 is a plan view for illustrating a bipolar electrode (hereinafter referred to as a "comb type") used in an electrostatic adsorption body (laminate sheet) according to Example 2 [numerical values in FIG. 2 indicate that the width of each comb tooth (electrode width) is 10 mm and the interval (pitch) between electrodes is 2 mm].

As shown in FIG. 1, in an electrostatic adsorption body of the present invention, at least a resin film serving as an adsorption surface with respect to an object to be adsorbed, an electrode layer, and an insulator are sequentially laminated, the electrode layer forms a laminate sheet interposed between the resin film and the insulator, and a power supply device (not shown) configured to apply a voltage to the electrode layer is provided. In addition, as shown in FIGS. 1 and 2, regarding the electrode layer, a bipolar electrode including a positive electrode and a negative electrode is provided. Hereinafter, respective configurations will be described in detail.

<Resin Film>

In the electrostatic adsorption body of the present invention, the resin film used for the adsorption surface with respect to the object to be adsorbed needs to have a volume resistivity of $1\times10^{10}$ to $10^{13}$ Ω·cm. As shown in examples to be described below, when the volume resistivity of the resin film serving as the adsorption surface exceeds $1\times10^{13}$ Ω·cm, the adsorption force with respect to the object to be adsorbed decreases, and for example, the object to be adsorbed may fall off even due to its own weight. On the other hand, if the volume resistivity is less than $1\times10^{10}$ Ω·cm, it is presumed that an electrostatic adsorption force itself acting on the object to be adsorbed will increase, but this is not preferable because a leakage current can occur between the adsorption surface and the object to be adsorbed and damage to fibers (object to be adsorbed) such as paper or cloth can occur. In consideration of exhibition of an adsorption force and safety, the volume resistivity is preferably $1\times10^{10}$ to $10^{12}$ Ω·cm.

In addition, the resin film serving as an adsorption surface needs to have a tensile modulus (Young's modulus) of 1 MPa or more and less than 100 MPa. The reason for this is that, although the detailed principle is not clear, in this specification, in particular, many sheet-like insulation components to be adsorbed are relatively thin and soft, but adsorption can be performed to conform the shape of such an object to be adsorbed and the like, and thus for the resin film, at least the tensile modulus (Young's modulus) of the resin film serving as an adsorption surface is set to be within the above range. In addition, another reason for this, as will be described below, in this specification, in particular, when sheet-like insulation components to be adsorbed are adsorbed and peeled off one by one, the adsorption surface of the electrostatic adsorption body of the present invention preferably has a roll-like shape so that it has a curved surface. This is because it is preferable to have the above tensile modulus even if processing into such a shape is performed.

In addition, the resin film needs to have a thickness of 20 to 200 μm and preferably has a thickness of 50 to 100 μm in order to secure insulation, flexibility, adsorption conformability with respect to the object to be adsorbed, an adsorption force, and the like. When the thickness is less than 20 μm, dielectric breakdown is likely to occur, and if pinholes are formed in the resin film accordingly, there is a risk of it not being able to function as the electrostatic adsorption body. On the other hand, when the thickness exceeds 200 μm, this is not preferable because adsorption conformability and flexibility with respect to the object to be adsorbed deteriorate, the distance to the object to be adsorbed increases, and accordingly there is a risk of the adsorption force decreasing.

In addition, specific examples of the resin film described above include polyimide, polyethylene terephthalate (PET), nylon, polypropylene, polyurethane, soft polyvinyl chloride, and polyvinylidene chloride, and those obtained by performing a process for adjusting their conductivity (mixing with a filler, etc.). However, in order to set the volume resistivity and the tensile modulus to be within the above predetermined range, polyurethane or soft polyvinyl chloride is preferable, and soft polyvinyl chloride is more preferable.

<Insulator>

In addition, in the present invention, regarding the insulator used on the side opposite to the adsorption surface of the object to be adsorbed, an insulator the same as or different from the above resin film may be used, but there is a risk of a current that should flow between the resin film and the object to be adsorbed flowing to the side of the insulator. Therefore, regarding the insulator, it is preferable to use an insulator having a volume resistivity that is the same as or higher than that of the resin film. In addition, in order to exhibit flexibility of the entire electrostatic adsorption body (laminate sheet), the tensile modulus (Young's modulus) of the insulator is preferably about the same as the tensile modulus (Young's modulus) of the resin film. Here, the thickness of the insulator needs to be 20 to 200 μm, and is preferably 50 to 100 μm, for the same reason as in the case of the resin film.

Specific examples of such an insulator are not limited, but it is possible to use the same insulator as in the resin film or ceramics such as aluminum nitride and alumina. However, as in the case of the resin film, preferable examples thereof include polyimide, polyethylene terephthalate (PET), nylon, polypropylene, polyurethane, soft polyvinyl chloride, polyvinylidene chloride and the like and an object obtained by performing a process for adjusting their conductivity (mixing with a filler, etc.). In order to set the volume resistivity and the tensile modulus to be within the above predetermined range, polyurethane or soft polyvinyl chloride is preferable, and soft polyvinyl chloride is more preferable.

<Electrode Layer>

Regarding the electrode layer used in the present invention, if unipolarity is desired, it is necessary to arrange an electrode near the object to be adsorbed, but, in particular, when the object to be adsorbed is cloth, it is not possible to perform such arrangement, and thus a bipolar electrode having at least a positive electrode and a negative electrode is used. The material, the shape, and the like are not particularly limited, but the thickness needs to be 1 to 20 μm. When the thickness is less than 1 μm, there is a risk of the electrode layer being disconnected or the conductivity being lowered due to deformation of the electrostatic adsorption body, and on the other hand, when the thickness exceeds 20 μm, the hardness of the electrode layer tends to be high, and thus the flexibility of the entire electrostatic adsorption body is impaired and there is a risk of poor conformability with respect to the object to be adsorbed. Regarding the material and the production method, for example, a metal foil may be used without change, an object obtained by etching a metal formed by a sputtering method, an ion plating method or the like into a predetermined shape may be used, or an object formed into a predetermined shape by spraying a metal material or printing a conductive ink may be used.

Here, the shape of the bipolar electrode can be appropriately selected from among pattern shapes, for example, a flat shape, a semicircular shape, a comb shape and a mesh.

However, preferably, a pair of comb-like electrodes are preferably used, and more preferably, as shown in FIG. 2, a shape in which comb teeth of a pair of comb-like electrodes are formed by meshing with each other on the same plane while maintaining a certain interval between them may be used, and this is preferable because an adsorption force can be more strongly exhibited for the object to be adsorbed used in the present invention. The reason for this is that, although the detailed principle is not clear, in the present invention, in particular, since paper, cloth or the like to be adsorbed is a sheet-like insulation component, it is speculated that a Coulomb force that occurs predominantly when the object to be adsorbed is a conductor or a semiconductor decreases, and on the other hand, it is confirmed that, when the pair of comb-like electrodes described above are used for the electrode layer, a gradient force is exhibited between them and the sheet-like insulation component (object to be adsorbed), and a stronger adsorption force than that when a general flat bipolar electrode composed of a positive electrode and a negative electrode is used can be exhibited.

In addition, for the bipolar electrode of the present invention, as described above, when comb teeth of a pair of comb-like electrodes are formed by meshing with each other on the same plane while maintaining a certain interval between them, preferably, the width (electrode width) of each comb tooth is 0.5 to 20 mm and the interval (pitch) between the comb teeth is 0.5 to 10 mm, and more preferably, the width (electrode width) of each comb tooth is 1 to 10 mm and the interval (pitch) between the comb teeth is 1 to 2 mm. When the width (electrode width) of each comb tooth is 1 mm or more, the processability of the electrode is improved, and on the other hand, when the width is 10 mm or less, this is preferable because a decrease in the adsorption force can be minimized. In addition, when the interval (pitch) between the comb teeth is 1 mm or more, it contributes to minimizing discharge between the electrodes, and on the other hand, when the interval is 2 mm or less, this is preferable because a decrease in the adsorption force can be minimized. That is, when the width (electrode width) of each comb tooth and the interval (pitch) between the comb teeth are formed in this manner, this is preferable because it is possible to secure the adsorption force, the processability of the electrode, and the safety during use.

<Laminate Sheet>

In addition, the resin film, the electrode layer and the insulator are used and laminated to form a laminate sheet. It is necessary to interpose the laminate sheet between the resin film and the insulator so that the electrode layer is not exposed, and regarding a specific method, a method in which the resin film, the electrode layer and the insulator are sequentially laminated, and heat and pressure are applied to fuse them may be exemplified. Alternatively, as necessary, they may be bonded via a bonding sheet, an adhesive or a pressure-sensitive adhesive. However, when the electrostatic adsorption body is deformed and expanded and contracted, if another component is inserted into the adhesive layer, since there is a risk of deformation and expansion and contraction being inhibited and a bonding surface being peeled off, a fusing method using thermoplasticity of the film is preferable.

Here, regarding the laminate sheet, a flat sheet formed by laminating the resin film, the electrode layer and the insulator is used without change or its shape and the like may be appropriately change according to the state of the object to be adsorbed. Specifically, when a plurality of sheet-like insulation components to be adsorbed in the present invention are stacked and the adhesion between the sheet (objects to be adsorbed) is strong, it may be difficult to peel them off one by one. Therefore, it is required to reliably adsorb and peel off only the first sheet on the outermost surface. As a result of verification by the inventors, as shown in FIG. 4(i), it was found that, when the sheet is formed into a roll shape so that the adsorption surface of the electrostatic adsorption body of the present invention (laminate sheet) becomes a curved surface and this is rolled on the surface of the object to be adsorbed, an operation of peeling off (lifting) the object to be adsorbed one by one is performed. On the other hand, it is found that, even if the electrostatic adsorption body (laminate sheet) is flat and the adsorption surface thereof remains flat, as shown in FIG. 5(ii), the area of the adsorption surface is made smaller than the area of the object to be adsorbed, and thus it is preferable to eliminate an influence of the adsorption force on the second and subsequent objects to be adsorbed from the outer circumferential side of the electrostatic adsorption body (laminate sheet) as much as possible. Regarding the former, for example, it is preferable to perform bending so that the radius of curvature R on the side of the adsorption surface of the electrostatic adsorption body (laminate sheet) is about 25 mm, and other shapes are used without particular limitation as long as such a curved surface (curved part) is formed. In addition, regarding the latter, the area of the adsorption surface is preferably about 80% of the area of the object to be adsorbed.

<Power Supply Device>

After the laminate sheet is formed as described above, a power supply device that applies a voltage to the electrode layer and generates an electrical adsorption force is required. The power supply device can be connected to the electrode layer of the laminate sheet via a connecting terminal and a switch (neither is shown), and one similar to that used in a general electrostatic adsorption structure can be used, or any device that can generate a high DC voltage may be used. The potential difference to be generated can be about $\pm 100$ to $\pm 5,000$ V, and as necessary, a voltage boosting circuit (high voltage generation circuit) that can boost to a required voltage may be provided.

The electrostatic adsorption body of the present invention includes the above laminate sheet and power supply device. In the electrostatic adsorption body of the present invention, as necessary, a sensor and the like may be separately provided, and for example, appropriate modifications and additions to the configuration such as changing the pattern of the electrode layer are possible within the scope of the object of the present invention.

Here, in the present invention, the object to be adsorbed as an adsorption target includes not only an insulator but also, in particular, sheet-like paper, cloth and a resin film having high insulation among objects required to be adsorbed via a gradient force, but the present invention is not limited thereto. Preferably, the sheet-like insulation component is particularly a component having a thickness of about 0.1 to 0.5 mm and exhibiting insulation and a volume resistivity of about $10^{12}$ to $10^{14}$ $\Omega \cdot cm$.

EXAMPLES

While preferable embodiments of the present invention will be described below in detail with reference to examples and comparative examples, the present invention need not be considered to be limited.

Example 1

<Production of Electrostatic Adsorption Body (Flat Electrode)>

First, a double-sided Kapton (registered trademark) tape [product name: Kapton (registered trademark) double-sided tape 760H commercially available from TERAOKA SEISAKUSHO CO., LTD.] was attached to one surface side of a copper foil (thickness: 18 μm) serving as an electrode layer. Next, as shown in FIG. 1, only a copper foil part thereof was cut out into two electrodes [the width of each electrode was 30 mm (length of 60 mm) and the interval (pitch) between electrodes was 2 mm] with a cutting plotter (product name: FC2250-180VC, commercially available from GRAPHTEC Corporation) to form an electrode pattern and an electrode sheet was formed, and then an insulator (product name: Grafoam GF-5 commercially available from Kinugawa Pack Co, Ltd.) was adhered to the surface opposite to the surface of the copper foil of the electrode sheet as a base substrate. After the unnecessary parts of the copper foil were removed, a soft polyvinyl chloride film [volume resistivity: $1 \times 10^{10}$ Ω·cm (measured by the method to be described below), tensile modulus (Young's modulus): 20 to 30 MPa, thickness of 100 μm] was attached to the surface side of the copper foil as a resin film using a laminator and a roller, and the electrode layer (copper foil) was interposed between the insulator and the resin film to obtain a bipolar laminate sheet.

A power supply device [a power supply device including a high voltage generating device (±2,000 V output), a power cable and a 24 V power supply] was attached to the laminate sheet produced in this manner to obtain an electrostatic adsorption body according to Example 1.

<Evaluation of Adsorption of Electrostatic Adsorption Body>

Figure 3:
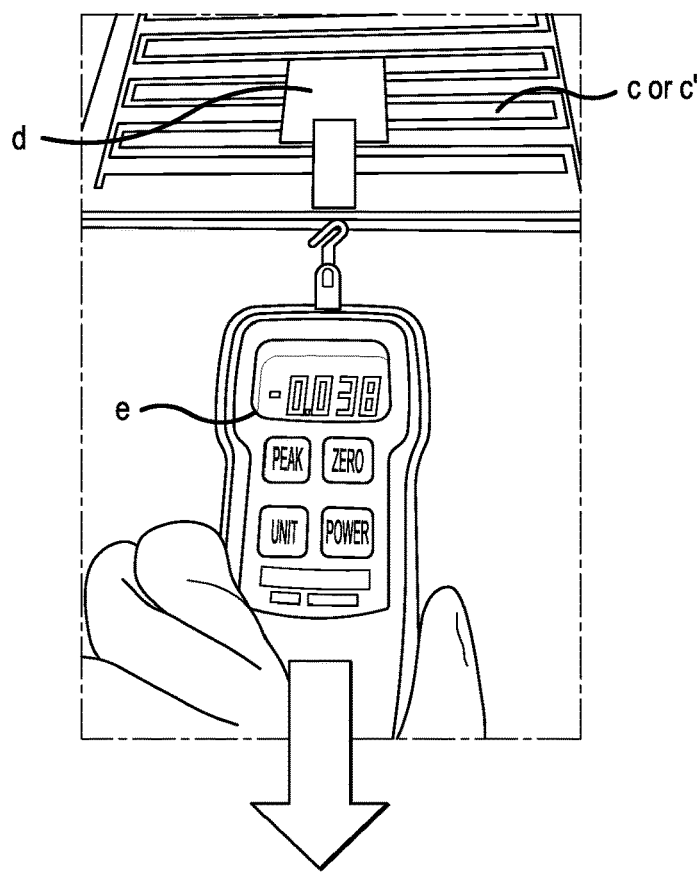
FIG. 3 is a photo for explaining a method of evaluating adsorption of an electrostatic adsorption body performed in examples.

A voltage of ±2 kV was applied to the produced electrostatic adsorption body according to Example 1, and 4 types of test pieces [copy paper (woodfree paper, thickness: about 0.092 mm), a piece of 100% polyester (PE) cloth (thickness of about 0.47 mm), a piece of 100% cotton cloth 1 (hereinafter referred to as "cotton 1," a hard fabric with a preprint handcraft pattern, a thickness of about 0.24 mm), and a piece of 100% cotton cloth 2 (hereinafter referred to as "cotton 2," soft fabric for underwear, thickness of about 0.32 mm) serving as the object to be adsorbed were placed on the adsorption surface (the side of the resin film) and adsorbed. A loop-like hook part (made of nylon) attached to the test piece in advance was hooked with a hook of a push-pull gauge (product name: digital force gauge FGJN-5 commercially available from NIDEC-SHIMPO CORPORATION), and the push-pull gauge was then pulled in the horizontal direction, and the measurement result was used as an adsorption force (unit: gf/cm$^2$) for each test piece. This mode is shown in FIG. 3, and the results are shown in the following Table 1.

TABLE 1

| | Electrode layer | | Resin film | | | Adsorption force of object to be adsorbed (gf/cm$^2$) | | | |
|---|---|---|---|---|---|---|---|---|---|
| | Shape | Width and pitch | Material | Volume resistivity (Ω · cm) | Tensile modulus (MPa) | Paper | PE | Cotton 1 | Cotton 2 |
| Example 1 | Flat | Width 30 mm, pitch 2 mm | Soft polyvinyl chloride | $1 \times 10^{10}$ | 20 to 30 | 32.8 | 6.1 | 1.4 | 0.5 |
| Example 2 | Comb teeth | Width 10 mm, pitch 2 mm | | $1 \times 10^{10}$ | 20 to 30 | 58.8 | 11.3 | 5.7 | 4.5 |
| Example 3 | Comb teeth | Width 10 mm, pitch 5 mm | | $1 \times 10^{10}$ | 20 to 30 | 50.1 | 7.3 | 3.1 | 1.8 |
| Comparative Example 1 | Flat | Width 60 mm, pitch 2 mm | Polyimide (Kapton H) | $1 \times 10^{17}$ | $3 \times 10^3$ | 6.2 | 2.1 | 0.0 | 0.0 |
| Comparative Example 2 | Comb teeth | Width 0.7 mm, pitch 0.7 mm | | | | 10.3 | 0.4 | 0.0 | 0.0 |

Here, the volume resistivity of the soft polyvinyl chloride film in Example 1 was measured using a double ring electrode method (IEC60093, ASTM D257, JIS K6911, JIS K6271), and the volume resistivity of the resin films used in Examples 2 and 3 and Comparative Examples 1 and 2 to be described below was measured by the same method.

Example 2

An electrostatic adsorption body according to Example 2 was produced in the same manner as in Example 1 except that a comb-like electrode obtained by meshing a pair of comb teeth on the same plane as shown in FIG. 2 [the width of each comb tooth (electrode width) was 10 mm and the interval (pitch) between electrodes was 2 mm] was used as the electrode layer, and the adsorption thereof was evaluated in the same manner. The results are shown in Table 1.

Example 3

An electrostatic adsorption body according to Example 3 was produced in the same manner as in Example 2 except that a comb-like electrode was used as the electrode layer as in Example 2, and the width of each comb tooth (electrode width) was set to 10 mm and the interval (pitch) between the electrodes was set to 5 mm, and the adsorption thereof was evaluated in the same manner. The results are shown in Table 1.

Comparative Example 1

An electrostatic adsorption body according to Comparative Example 1 was produced in the same manner as in Example 1 except that a polyimide film [commercially available from DU PONT-TORAY CO., LTD. product name: Kapton (registered trademark) H, volume resistivity: $1 \times 10^{17}$ Ω·cm (measured by the above method), tensile modulus (Young's modulus): $3 \times 10^3$ MPa, thickness 50 μm] was used as the resin film serving as the adsorption surface of the object to be adsorbed and the same flat bipolar electrode [electrode width was 60 mm (length of 110 mm) and the interval (pitch) between electrodes was 2 mm] as in Example 1 was used as the electrode layer, and the adsorption thereof was evaluated in the same manner. The results are shown in Table 1.

Comparative Example 2

An electrostatic adsorption body according to Comparative Example 2 was produced in the same manner as in Example 1 except that a polyimide film [commercially available from DU PONT-TORAY CO., LTD., product name: Kapton (registered trademark) H, volume resistivity: $1 \times 10^{17}$ Ω·cm (measured by the above method), tensile modulus (Young's modulus): $3 \times 10^3$ MPa, thickness 50 µm] was used as the resin film serving as the adsorption surface of the object to be adsorbed, and the same comb-like bipolar electrode [the width of each comb tooth (electrode width) was 0.7 mm and the interval (pitch) between electrodes was 0.7 mm] as in Example 2 was used as the electrode layer, and the adsorption thereof was evaluated in the same manner. The results are shown in Table 1.

Test Examples 1 to 12 (Measurement of Adsorption Force Depending on Electrode Width)

Electrostatic adsorption bodies of Test Examples 1 to 12 were produced in the same manner as in Example 2 except that the comb-like electrode as in Example 2 was used as the electrode layer and the width (electrode width) of each comb tooth was changed to 1 mm to 30 mm while the interval (pitch) between the electrodes was fixed to 2 mm, and the adsorption thereof was evaluated in the same manner. The results are shown in Table 2. Here, the reason why the result of the adsorption force (gf/cm$^2$) obtained in Test Example 10 using an electrode layer having the same electrode width and pitch as in Example 2 was different from that of Example 2 was speculated to be due to the influence of the temperature and humidity during measurement because the experiment dates were different.

TABLE 2

| Electrode layer | | Adsorption force of object to be adsorbed (gf/cm$^2$) | | | |
| --- | --- | --- | --- | --- | --- |
| Electrode width (mm) | Pitch (mm) | Paper | PE | Cotton 1 | Cotton 2 |
| Test Example 1 | 1.0 | 2 | 28.7 | 6.1 | 1.6 | 1.4 |
| Test Example 2 | 2.0 | | 43.0 | 8.2 | 2.9 | 1.6 |
| Test Example 3 | 3.0 | | 51.5 | 10.1 | 3.3 | 1.3 |
| Test Example 4 | 4.0 | | 54.8 | 10.6 | 3.3 | 0.9 |
| Test Example 5 | 5.0 | | 72.8 | 11.2 | 3.6 | 1.1 |
| Test Example 6 | 6.0 | | 60.9 | 12.2 | 3.5 | 0.7 |
| Test Example 7 | 7.0 | | 65.0 | 12.2 | 3.4 | 0.8 |
| Test Example 8 | 8.0 | | 57.3 | 11.1 | 3.2 | 0.6 |
| Test Example 9 | 9.0 | | 59.5 | 12.1 | 3.2 | 0.4 |
| Test Example 10 | 10.0 | | 63.4 | 14.9 | 3.4 | 0.5 |
| Test Example 11 | 20.0 | | 51.7 | 11.6 | 3.3 | 0.7 |
| Test Example 12 | 30.0 | | 46.2 | 9.3 | 2.2 | 0.3 |

Test Examples 13 to 17 (Measurement of Adsorption Force Depending on Electrode Pitch)

Electrostatic adsorption bodies of Test Examples 13 to 17 were produced in the same manner as in Example 2 except that the comb-like electrode as in Example 2 was used as the electrode layer, and the interval (pitch) between the electrodes was changed to 1 mm to 5 mm while fixing the width (electrode width) of each comb tooth to 10 mm, and the adsorption thereof was evaluated in the same manner. The results are shown in Table 3. Here, the reason why the result of the adsorption force (gf/cm$^2$) obtained in Test Example 14 using an electrode layer having the same electrode width and pitch as in Example 2 and Test Example 10 was different from those of Example 2 and Test Example 10 was speculated to be due to the influence of the temperature and humidity during measurement because the experiment dates were different.

TABLE 3

| Electrode layer | | Adsorption force of object to be adsorbed (gf/cm$^2$) | | | |
| --- | --- | --- | --- | --- | --- |
| Electrode width (mm) | Pitch (mm) | Paper | PE | Cotton 1 | Cotton 2 |
| Test Example 13 | 10.0 | 1.0 | 47.2 | 9.9 | 4.1 | 2.1 |
| Test Example 14 | | 2.0 | 40.9 | 10.2 | 3.5 | 2.1 |
| Test Example 15 | | 3.0 | 41.6 | 8.5 | 3.6 | 1.5 |
| Test Example 16 | | 4.0 | 42.9 | 6.9 | 2.7 | 2.0 |
| Test Example 17 | | 5.0 | 50.1 | 7.3 | 3.1 | 1.8 |

Test Examples 18 and 19 (Comparison of Adsorption Depending on Shape of Electrostatic Adsorption Body)

Two electrostatic adsorption bodies produced in Example 2 were prepared, one of the electrostatic adsorption bodies was bent so that the adsorption surface was a curved surface with a radius of curvature R of about 25 mm as in FIG. 4(i), and when this was brought into contact with the outermost surface of a plurality of stacked pieces of 100% polyester (PE) cloth (210 mm×297 mm, thickness of about 0.047 mm) serving as the object to be adsorbed in a rolling manner, a success rate of only the first sheet on the outermost surface being adsorbed and peeled off was checked (Test Example 18). The other electrostatic adsorption body was directly used without bending the adsorption surface as shown in FIG. 4(ii) (Test Example 19). The applied voltage was ±2 kV, and each test was performed 20 times.

In the results, in Test Example 18 in which the adsorption surface of the electrostatic adsorption body was a curved surface, the probability that only the piece of cloth on the outermost surface was adsorbed and peeled was 80%, and in Test Example 19 in which the flat adsorption surface was used without change, the success rate was merely 5%. In Test Example 19 in which the flat adsorption surface was used without change, it was speculated that the electrostatic force also acted on the second and subsequent stacked pieces of cloth and the success rate was extremely lowered.

Test Examples 20 and 21 (Comparison of Adsorption Depending on Adsorption Area of Electrostatic Adsorption Body)

Two electrostatic adsorption bodies produced in Example 2 were prepared, one electrostatic adsorption body was used without change as in FIG. 5(i) (the area of the adsorption surface: 62,370 mm$^2$, Test Example 20), and the other electrostatic adsorption body was cut out so that the area of the adsorption surface was 80% of the area of the object to be adsorbed as shown in FIG. 5(ii) (Test Example 21), and when the adsorption surface of each of these electrostatic adsorption bodies was adsorbed on a plurality of stacked pieces of 100% polyester (PE) cloth (210 mm×297 mm, thickness of about 0.47 mm, area: 62370 mm$^2$) serving as the object to be adsorbed, a success rate of only the first sheet on the outermost surface being adsorbed and peeled was checked. The applied voltage was ±2 kV, and each test was performed 20 times.

In the results, in Test Example 20 in which the area of the adsorption surface of the electrostatic adsorption body was the same area of the piece of polyester cloth serving as the object to be adsorbed, the probability that only the piece of cloth of the outermost surface was adsorbed and peeled was merely 5%, and in Test Example 21 in which the area of the adsorption surface of the electrostatic adsorption body was smaller than the area of the piece of polyester cloth serving as the object to be adsorbed, the success rate was excellent at 100%. When the area of the adsorption surface of the electrostatic adsorption body was larger than that of the object to be adsorbed, it was speculated that the electrostatic force also acted on the second and subsequent stacked pieces of cloth and the success rate was extremely lowered.

REFERENCE SIGNS LIST a Electrode (positive electrode or negative electrode)
b Resin film
b' Insulator
c, c' Electrostatic adsorption body (laminate sheet)
d Object to be adsorbed
e Push-pull gauge

The invention claimed is:

1. An electrostatic adsorption body adsorbing an object to be adsorbed with an electrostatic adsorption force, the electrostatic adsorption body comprising: a laminate sheet in which an insulator with a thickness of 20 to 200 μm, an electrode layer with a thickness of 1 to 20 μm, and a resin film with a thickness of 20 to 200 μm are sequentially laminated; and a power supply device that applies a voltage to the electrode layer, wherein the resin film at least has a tensile modulus of 1 MPa or more and less than 100 MPa and a volume resistivity of $1\times10^{10}$ to $10^{13}$ Ω·cm, the electrode layer is composed of a bipolar electrode including a positive electrode and a negative electrode, and an object to be adsorbed is adsorbed using the resin film as an adsorption surface due to an electrostatic adsorption force that is generated by applying a voltage to the electrode layer.

2. The electrostatic adsorption body according to claim 1, wherein the resin film is composed of soft polyvinyl chloride.

3. The electrostatic adsorption body according to claim 1, wherein the electrode layer composed of the bipolar electrode is a pair of comb-like electrodes.

4. The electrostatic adsorption body according to claim 3, wherein the electrode layer composed of the bipolar electrode is formed by meshing comb teeth of the pair of comb-like electrodes on a same plane while maintaining a certain interval therebetween, a width of each of the comb teeth is 0.5 to 20 mm, and the interval between the comb teeth is 0.5 to 10 mm.

5. The electrostatic adsorption body according to claim 1, wherein at least the adsorption surface adsorbing the object to be adsorbed is a curved surface.

6. The electrostatic adsorption body according to claim 1, wherein an area of the adsorption surface is smaller than an area of the object to be adsorbed.

7. The electrostatic adsorption body according to claim 1, wherein the object to be adsorbed is a sheet-like insulation component.

\* \* \* \* \*